(12) United States Patent
Ishimori et al.

(10) Patent No.: US 8,450,929 B2
(45) Date of Patent: May 28, 2013

(54) LIGHT EMITTING DEVICE, BACKLIGHT UNIT, LIQUID CRYSTAL DISPLAY APPARATUS, AND LIGHTING APPARATUS

(75) Inventors: Atsuyoshi Ishimori, Osaka (JP); Yasuharu Ueno, Osaka (JP); Kazuyuki Kobashi, Kyoto (JP); Yoshihiko Kanayama, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/394,351

(22) PCT Filed: Jun. 24, 2011

(86) PCT No.: PCT/JP2011/003638
§ 371 (c)(1),
(2), (4) Date: Mar. 6, 2012

(87) PCT Pub. No.: WO2012/001938
PCT Pub. Date: Jan. 5, 2012

(65) Prior Publication Data
US 2012/0169968 A1      Jul. 5, 2012

(30) Foreign Application Priority Data
Jun. 28, 2010  (JP) .................................. 2010-146911

(51) Int. Cl.
*H01J 1/62*           (2006.01)
(52) U.S. Cl.
USPC ........................................... 313/512; 257/79
(58) Field of Classification Search
USPC .......... 313/512, 504–506; 257/79; 445/23–25
See application file for complete search history.

(56) References Cited

U.S. PATENT DOCUMENTS

| | | |
|---|---|---|
| 2004/0190304 A1 | 9/2004 | Sugimoto et al. |
| 2006/0097385 A1 | 5/2006 | Negley |
| 2007/0228390 A1* | 10/2007 | Hattori et al. ................... 257/79 |
| 2009/0134421 A1 | 5/2009 | Negley |
| 2009/0272996 A1 | 11/2009 | Chakraborty |
| 2011/0085352 A1 | 4/2011 | Ito et al. |
| 2011/0210360 A1 | 9/2011 | Negley et al. |
| 2012/0057219 A1 | 3/2012 | Suyama et al. |

FOREIGN PATENT DOCUMENTS

| | | |
|---|---|---|
| JP | 2003-110146 | 4/2003 |
| JP | 2007-142152 | 6/2007 |
| JP | 2007-273562 | 10/2007 |
| JP | 2009-272634 | 11/2009 |
| JP | 2010-080553 | 4/2010 |
| WO | 2006/046981 | 5/2006 |
| WO | 2009/145298 | 12/2009 |

\* cited by examiner

*Primary Examiner* — Joseph L Williams
(74) *Attorney, Agent, or Firm* — Greenblum & Bernstein, P.L.C.

(57) ABSTRACT

Provided is a light-emitting device which can reduce grainy texture, suppress color unevenness and luminance unevenness. A light-emitting device according to the present invention includes: a board; a plurality of light-emitting parts each of which includes (i) a LED chip mounted on the board and (ii) a phosphor-containing resin including a light wavelength converter and covering the LED chip. Further, the light-emitting device includes a light-guiding member provided on the board, between the light-emitting parts which are adjacent to each other. Furthermore, the light-guiding member is formed to cover part of the phosphor-containing resin.

19 Claims, 10 Drawing Sheets

LIGHT EMITTING DEVICE, BACKLIGHT UNIT, LIQUID CRYSTAL DISPLAY APPARATUS, AND LIGHTING APPARATUS

TECHNICAL FIELD

The present invention relates to light-emitting devices, backlight units, liquid crystal display apparatuses, and lighting apparatuses, and particularly relates to a light-emitting device and the like that use a semiconductor light-emitting element.

BACKGROUND ART

Semiconductor light-emitting elements such as a Light Emitting Diode (LED) have been widely used in recent years as a highly efficient and space saving light source, and are, for example, used as a backlight source in liquid crystal display apparatuses such as a liquid crystal display television or an illumination light source in lighting apparatuses.

The LED used in backlight sources and illumination light sources are configured as a light-emitting device (light-emitting module). The light-emitting device is configured by sealing with a resin an LED that is disposed on a board. For example, an edge-lit backlight unit employs a light-emitting device that includes a plurality of LEDs that are arranged on a board in a one-dimensional row.

Such light-emitting device is often used as a white light source. For example, Patent Literature (PTL) 1 discloses a light-emitting device that emits white light by exciting yellow phosphors using a blue LED.

CITATION LIST

Patent Literature

PTL 1

Japanese Unexamined Patent Application Publication No. 2007-142152

SUMMARY OF INVENTION

Technical Problem

Here, in recent years, a light-emitting device using an LED has been mounted on a board in an attempt to develop LED light sources that replace conventional light sources such as a linear fluorescent lamp and a backlight.

The light-emitting devices that are incorporated into such light sources use Surface Mount Device (SMD) type LED, Chip On Board (COB) type LED, and the like.

An SMD type light-emitting device is a package type light-emitting device. Namely, an LED chip is mounted in a cavity formed by a resin or the like, and the inside of the cavity is sealed with a phosphor-containing resin.

On the other hand, in a COB type light-emitting device, an LED itself (bare chip) is directly mounted on a board. The bare chip and a line pattern on the board are wire-bonded, and the bare chip is sealed with the phosphor-containing resin.

Compared with the SMD type light-emitting device, the COB type light-emitting device is superior in terms of cost and luminous efficacy. Thus, development of alternative light source using the COB type light-emitting device is much anticipated.

An example of the COB type light-emitting device is described with reference to FIG. 10A to FIG. 10C. FIG. 10A is an external perspective view of the example of the COB type light-emitting device. FIG. 10B is a partial enlarged plan view of the example of the light-emitting device shown in FIG. 10A. FIG. 10C is a partial enlarged cross-sectional view of the example of the light-emitting device taken along a line X-X' in FIG. 10B.

As shown in FIG. 10A, a light-emitting device 700 includes a board 710 and a plurality of light-emitting parts 720 that are arranged linearly on the board 710. Furthermore, as shown in FIG. 10B and FIG. 10C, each of the light-emitting parts 720 of the light-emitting device 700 includes: a LED chip 721 mounted on the board 710; and a dome-shaped phosphor-containing resin 722 (phosphor layer) which is for sealing the LED chip 721. Further, the light-emitting device 700 includes: a metal line 740 patterned on the board 710; and a wire 760 which connects the metal line 740 and electrodes of the LED chip 721.

In the phosphor-containing resin 722, predetermined phosphor particles are dispersed. The phosphor particles convert the color of light emitted by the LED chip 721 and thus light of a desired color is emitted from the light-emitting device. For example, when a blue LED chip that emits blue light is used as the LED chip 721 with yellow phosphor particles as the phosphor particles, the yellow phosphor particles are excited by the blue light of the blue LED chip and thus emit yellow light. The combination of the yellow light and the blue light of the blue LED chip results in an emission of white light.

However, the light-emitting device 700 shown in FIG. 10A to FIG. 10C includes the light-emitting parts 720 and non-light-emitting parts that are other than the light-emitting parts. This results in problems such as giving a grainy texture (less attractive appearance) and an occurrence of color unevenness and luminance unevenness.

The present invention has been conceived to solve the aforementioned problems and has as an object to provide the light-emitting device and the like which can reduce grainy texture and suppress color unevenness and luminance unevenness.

Solution to Problem

In order to solve the problems described above, a light-emitting device according to an aspect of the present invention includes a board; a plurality of light-emitting parts each of which includes (i) a semiconductor light-emitting element mounted on the board and (ii) a wavelength conversion layer including a light wavelength converter and covering the semiconductor light-emitting element; and a light-guiding member provided on the board, between the light-emitting parts which are adjacent to each other.

As described, the light-guiding member is provided between the light-emitting parts which are adjacent to each other. Thus, the light from the light-emitting part can be guided to the light-guiding member. This allows the light-guiding member that is provided between the light-emitting parts to emit light, in addition to the light emitted from the light-emitting part. A light emitting region can be thus expanded in appearance. Therefore, it is possible to reduce grainy texture, suppress color unevenness and luminance unevenness, and improve luminance uniformity.

Further, in the light-emitting device according to an aspect of the present invention, it is preferable that the light-guiding member be adjacent to the wavelength conversion layer.

With this, the light from the light-emitting part can be guided to the light-guiding member easily Further, in the light-emitting device according to an aspect of the present invention, it is preferable that the light-guiding member be formed to cover part of the wavelength conversion layer.

With this, light is guided, from the portion of the wavelength conversion layer covered by the light-guiding member, to the light-guiding member. This increases the light emitting region. From the portion of the wavelength conversion layer not covered by the light-guiding member, light is directly emitted from the wavelength conversion layer without passing through the light-guiding member. Therefore, the light emitting region can be expanded without decreasing the amount of light extracted in the light-emitting part. Further, side portions of the wavelength conversion layer are covered by the light-guiding member. In this way, it is possible to form the light-guiding member on a portion having a long optical path length, and thus the color unevenness (color separation) can be reduced.

Further, in the light-emitting device according to an aspect of the present invention, it is preferable that at least an end portion of the light-guiding member on a side of the semiconductor light-emitting element be on a side of the semiconductor light-emitting element with respect to a normal that extends from an intersection between the board and one of (i) an outline of the light-emitting part and (ii) an extension of the outline.

With this, an appropriate balance in an amount of light is achieved between the light directly emitted from the light-emitting part and the light emitted through the light-guiding member, and thus luminance uniformity can be improved.

Further, in the light-emitting device according to an aspect of the present invention, it is preferable that the light-guiding member connect the light-emitting parts which are adjacent to each other.

With this, a continuous light emitting region can be formed without a gap between the light-emitting parts. Therefore, it is possible to further reduce grainy texture, suppress color unevenness and luminance unevenness, making it possible to further improve luminance uniformity in the elongated direction.

Further, in the light-emitting device according to an aspect of the present invention, it is preferable that the light-guiding member have a function of diffusing light that is guided in the light-guiding member.

With this, the light which is emitted from the light-emitting part and propagates through the light-guiding member is redirected such that the light travels toward a light extraction surface. Therefore, it is possible to improve the light extraction efficiency in the light-guiding member.

Further, in the light-emitting device according to an aspect of the present invention, it is preferable that the light-guiding member include a diffusion material.

With this, the light can be redirected easily with the diffusion material.

Further, in the light-emitting device according to an aspect of the present invention, it is preferable that density of the diffusion material in the light-guiding member be higher as a distance from the semiconductor light-emitting element is greater.

With this, it is possible to improve the luminance uniformity in the light-guiding member.

Further, in the light-emitting device according to an aspect of the present invention, it is preferable that $n1 \leq n2$ be satisfied, when a refractive index of the wavelength conversion layer is denoted by $n1$ and a refractive index of the light-guiding member is denoted by $n2$.

This allows the light of the light-emitting part to enter the light-guiding member easily.

Further, in the light-emitting device according to an aspect of the present invention, it is preferable that the light-guiding member be a transparent resin.

With this, the light from the light-emitting part can be propagated in the light-guiding member, without decreasing the light extraction efficiency.

Further, in the light-emitting device according to an aspect of the present invention, it is preferable that the wavelength conversion layer be a phosphor layer including a phosphor which is excited by light of the semiconductor light-emitting element.

With this, the phosphor in the phosphor layer can be excited by the light of the semiconductor light-emitting element. Thus, it is possible to emit light of which wavelength is converted by the phosphor and light of which wavelength is not converted.

Further, in the light-emitting device according to an aspect of the present invention, it is preferable that the wavelength conversion layer be dome-shaped.

With this, it is possible to configure the light-emitting part having a superior light distribution property.

Further, in the light-emitting device according to an aspect of the present invention, it is preferable that the board be elongated, and the light-emitting parts and the light-guiding member be arranged linearly in a row along a longer direction of the board.

With this, it is possible to reduce the grainy texture in the longer direction of the board and to improve the luminance uniformity in the longer direction of the board.

Further, in the light-emitting device according to an aspect of the present invention, it is preferable that $0 \leq D1/L1 \leq L1/2n$ be satisfied, when a distance between the light-guiding members which are adjacent to each other is denoted by $D1$ and a length of the board in the longer direction is denoted by $L1$.

With this, the grainy texture can be almost completely eliminated and the luminance uniformity in the longer direction of the board can be improved.

Further, in the light-emitting device according to an aspect of the present invention, it is preferable that $1 \leq L1/L2$ be satisfied, when a length of the board in a shorter direction is denoted by $L2$.

With this, it is possible to provide an elongated light-emitting device having large aspect ratio.

Further, in the light-emitting device according to an aspect of the present invention, it is preferable that $0 < h1/h2 \leq 1$ be satisfied, when a height of the light-emitting part is denoted by $h1$ and a height of the light-guiding member is denoted by $h2$.

With this, it is possible to reduce the grainy texture, without decreasing the amount of light extracted in the light-emitting part.

Further, in the light-emitting device according to an aspect of the present invention, it is preferable that a groove for regulating a position of an end portion of the light-guiding member be formed on the board.

With this, it is possible to regulate the position of the end portion of the light-guiding member with a groove edge, and thus a region on which the light-guiding member is formed can be controlled easily.

Furthermore, a backlight unit according to an aspect of the present invention includes at least one of the aspects of the light-emitting device according to the present invention described above.

Furthermore, a liquid crystal display apparatus according to an aspect of the present invention includes: the aspect of the backlight unit according to the present invention described above; and a liquid crystal panel provided on an optical path of light emitted from the backlight unit.

Furthermore, a lighting apparatus according to an aspect of the present invention includes at least one of the aspects of the light-emitting device according to the present invention described above.

ADVANTAGEOUS EFFECTS OF INVENTION

In a light-emitting device according to the present invention, it is possible to reduce a grainy texture, and suppress color unevenness and luminance unevenness.

DESCRIPTION OF EMBODIMENTS

The following describes a light-emitting device, a backlight unit, a liquid crystal display apparatus, and a lighting apparatus according to embodiments of the present invention with reference to drawings. However, the present invention is defined by Claims. Accordingly, among the components in the embodiment, the components not described in Claims are not necessarily required for solving the problems of the present invention but included for a preferable embodiment. Note that dimensions, materials, and shapes of structures of examples described in the embodiments and their relative placement and the like are to be changed as appropriate depending on various conditions and a structure of an apparatus to which the present invention is applied, and the present invention is not limited to those examples. Furthermore, dimensions and the like in drawings are not strictly accurate.

Embodiment 1

Figure 1A:
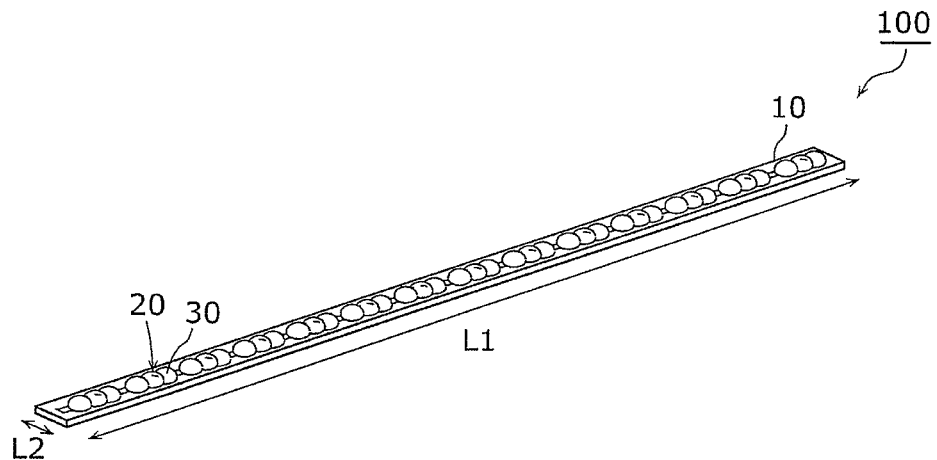
FIG. 1A is an external perspective view of a light-emitting device according to Embodiment 1 of the present invention.
Figure 1B:
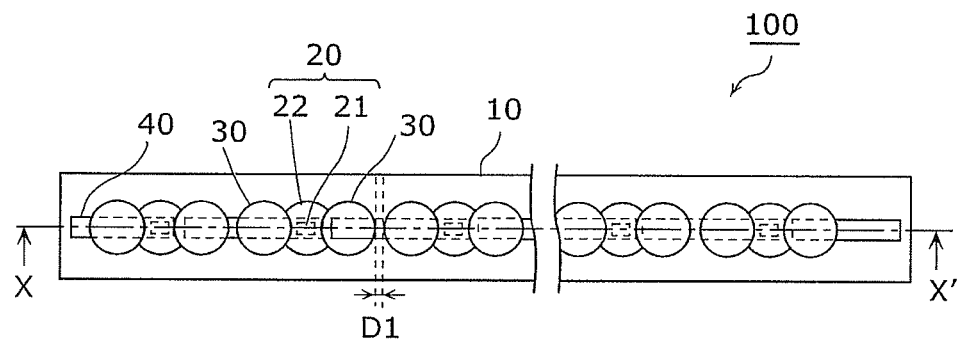
FIG. 1B is a plan view of the light-emitting device according to Embodiment 1 of the present invention.
Figure 1C:
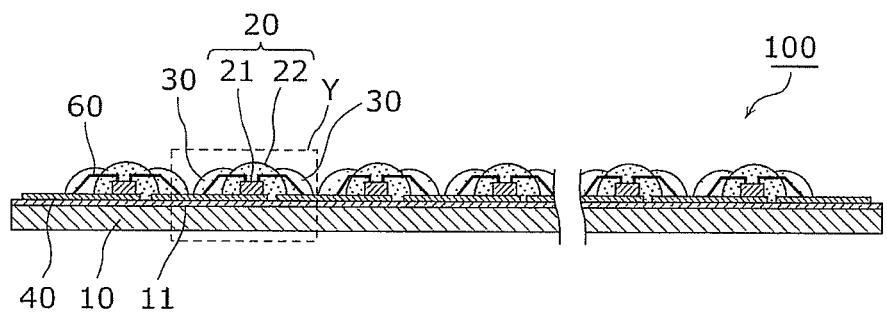
FIG. 1C is a cross-sectional view (cross-sectional view taken along the line X-X' in FIG. 1B) of the light-emitting device according to Embodiment 1 of the present invention.
Figure 2:
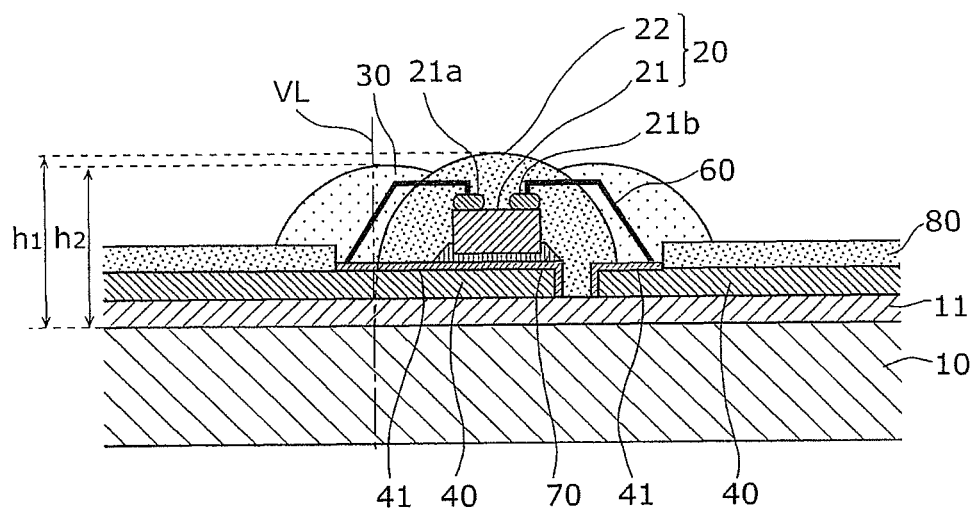
FIG. 2 is a partial enlarged cross-sectional view (enlarged view of the region Y in FIG. 1C) of the light-emitting device according to Embodiment 1 of the present invention.

First, a light-emitting device 100 according to Embodiment 1 of the present invention is described with reference to FIG. 1A to FIG. 1C and FIG. 2. FIG. 1A is a perspective view showing an overview of the light-emitting device according to Embodiment 1 of the present invention. FIG. 1B is a plan view of the light-emitting device according to Embodiment 1 of the present invention shown in FIG. 1A. FIG. 1C is a cross-sectional view of the light-emitting device according to Embodiment 1 of the present invention taken along the line X-X' in FIG. 1B. FIG. 2 is an enlarged view of the region Y surrounded by a broken line in FIG. 1C, and is a partial enlarged cross-sectional view of the light-emitting device according to Embodiment 1 of the present invention.

As shown in FIG. 1A, the light-emitting device 100 according to Embodiment 1 of the present invention includes: a board 10 which is in a rectangular, elongated shape; and islands of a plurality of light-emitting parts 20 provided on the board 10. In this embodiment, the light-emitting parts 20 that are dome-shaped are linearly arranged on the board 10. Furthermore, as shown in FIG. 2, the light-emitting device 100 according to this embodiment is a light-emitting device having a COB structure, that is, LED chips 21 (bare chips) themselves are directly mounted on the board 10. The following describes in detail each of components of the light-emitting device 100.

<Board>

As shown in FIG. 1A, the board 10 is a rectangular, elongated board. When the length of a longer direction (length of the long side) of the board 10 is denoted by L1 and the length of a shorter direction (length of the short side) is denoted by L2, $10 \leq L1/L2$ is satisfied. The long side length of the board 10 of the light-emitting device 100 described in this embodiment is, for example, 360 mm and about 70 LED chips 21 that are spaced apart from each other by 5 mm are mounted on the board 10. Here, for example, L1 is 100 mm or greater and L2 is 20 mm or smaller.

<Light-Emitting Part>

The light-emitting part 20 is a light emitting region, and includes a LED chip as a light emitting source. A plurality of the light-emitting parts 20 are arranged linearly in a row (one-dimensionally) along the longer direction of the board 10.

As shown in FIG. 1B and FIG. 1C, each of the light-emitting parts 20 in the light-emitting device 100 according to Embodiment 1 of the present invention includes: the LED chip 21 (semiconductor light-emitting element) that is directly mounted on one face of the board 10; and a phosphor-containing resin 22 (phosphor layer) that covers the LED chip 21. Furthermore, the phosphor-containing resin 22 in each of the light-emitting parts 20 is a separate island that is formed on the board 10 to cover the corresponding LED chip 21.

Each light-emitting part 20 in this embodiment includes: the LED chip 21 composed of a blue LED chip; and a phosphor-containing resin that contains yellow phosphor particles. In the light-emitting part 20, yellow phosphor particles are excited by blue light of the blue LED chip and emit yellow light. As a result, the combination of the excited yellow light and the blue light of the blue LED chip results in an emission of white light.

The phosphor-containing resin 22 is composed of a member that includes: a binder such as a resin; and a light wavelength converter such as phosphors. The phosphor-containing resin 22 is provided on the board 10 to cover the LED chip 21. The phosphor-containing resin 22 is a sealing material that protects the LED chip 21 and, also is a wavelength conversion layer that converts a wavelength of light from the LED chip 21.

In the present invention, the light wavelength converter is phosphor micro-particles or the like that convert the wavelength of light emitted from the LED chip 21. In this embodiment, yellow phosphor micro-particles are used as the phosphor micro-particles and are dispersed in silicone resin to form the phosphor-containing resin 22. A YAG (yttrium, aluminum, garnet) based phosphor material can be used as the yellow phosphor particles. Furthermore, the binder of the phosphor-containing resin 22 is not limited to a resin. For example, a transparent member such as glass, which is known to be used to seal a chip, may be used.

As shown in FIG. 1A to FIG. 1C, it is preferable that the shape of the phosphor-containing resin 22 be a substantially hemispherical dome shape that is upwardly convex. The dome-shaped phosphor-containing resin 22 described above does not regulate the light emitted from the LED chip 21. Thus, superior light distribution property of 90 degrees can be achieved.

Furthermore, when the substantially hemispherical dome shape is adopted as the shape of the phosphor-containing resin 22, it is preferable that a radius of curvature R (mm) of the outermost surface of the phosphor-containing resin 22 satisfy the relation of 0.2 $[1/mm] \leq 1/R \leq 2.0$ $[1/mm]$ so that the light distribution property can be improved. In this embodiment, the radius of curvature R is a value defined by the cross-section in the short direction of the board 10 on which the LED chip 21 is mounted. However, the shape of the phosphor-containing resin 22 is not particularly restricted in the present invention. The shape of the outermost surface may be parabolic. Note that the phosphor-containing resin (phosphor layer) of an SMD type light-emitting device has a planer surface, and thus the light distribution property is not so high and is, for example, about 80 degrees.

The method for forming the phosphor-containing resin 22 is not particularly restricted. Any methods that can cover the LED chip 21 with a sealing material such as a resin or glass may be used. Specific examples for the forming include: potting; dispensing; and molding by injecting the sealing material into a predetermined mold. Here, when the potting is adopted to form the phosphor-containing resin 22, it is preferable that the phosphor-containing resin 22 be made up of a material having high thixotropy. This makes it easy to form the dome-shaped phosphor-containing resin 22 upwardly (on a side of upper surface of the board) by the potting utilizing surface tension.

<Light-Emitting Member>

The light emitted from the light-emitting part 20 propagates through a light-guiding member 30. The light-guiding member 30 guides the light to another light-emitting part 20 in proximity so that light is connected, and thus works as a bypass of light. The light-guiding member 30 in this embodiment is in a substantially hemispherical dome shape that is upwardly convex. The light-guiding members 30 are arranged linearly in a row (one-dimensionally) along the longer direction of the board 10 in non-light-emitting parts between the light-emitting parts 20 which are adjacent to each other.

As shown in FIG. 2, the light-guiding members 30 cover the both sides of the phosphor-containing resin 22 in the longer direction of the board 10. The light-guiding member 30 is formed from a part of the side portion of the phosphor-containing resin 22 to cover a portion of a metal line 40 and a portion of a resist 80. It is preferable that the light-guiding member 30 be configured not to cover the vicinity of the top of the phosphor-containing resin 22. Covering the top of the phosphor-containing resin 22 by the light-guiding member 30 can result in reduced light extraction efficiency due to loss of light emitted from the top side. In this regard, when the light-guiding member 30 is formed from a part of the side portion of the phosphor-containing resin 22 to cover a portion of the metal line 40 and a portion of the resist 80, the light-guiding member 30 works as a bypass for the light emitted through the phosphor-containing resin 22. Thus, light is guided to the light-guiding member 30 from the region of the phosphor-containing resin 22 covered by the light-guiding member 30, and thus the light emitting region can be expanded.

Furthermore, when a region not covered by the light-guiding member 30 is provided on the top of the phosphor-containing resin 22 as described above, light can be directly emitted from the light-emitting part 20 through the non-covered region without passing through the light-guiding member 30. Therefore, the light emitting region can be expanded without decreasing the amount of light extracted in the light-emitting part 20.

Methods for forming the light-guiding member 30 are not particularly restricted. The same methods as the method for forming the phosphor-containing resin 22 described above may be adopted. With an object to improve the light extraction efficiency by the light-guiding member 30, it is preferable that the potting be adopted. In this way, it is possible to easily form the light-guiding member 30 having an overall shape that is upwardly convex, substantially hemispherical dome shape.

A transparent resin that is a translucent material made of silicone resin and the like can be used as the light-guiding member 30. Note that a material other than the transparent resin can be used as a material of the light-guiding member 30. For example, glass, which is known to be used to seal a chip, can be used. Furthermore, considering the combination with the sealing material which is for covering the LED chip 21, the light-guiding member 30 may be formed of a material different from the material of the sealing material. However, with an object to reduce the grainy texture, it is preferable that the light-guiding member 30 be made of a material that is of the same type as the material of the sealing material. In this way, an interface where materials overlap is not clearly created and light reflection on the interface can be suppressed.

\<Non-Light-Emitting Part\>

In the present invention, non-light-emitting parts in the light-emitting device 100 are a non-light emitting region other than the light-emitting parts 20. Each of the non-light-emitting part includes the metal line 40 and the like. The metal line 40 is a line pattern that is patterned such that a plurality of the LED chips 21 can be connected in series on insulating film 11 formed on the board 10. The metal line 40 and the LED chip 21 are electrically connected through a wire 60. Thus, the LED chips 21 are connected in series.

\<LED Chip\>

The LED chip 21 is mounted on an end portion of the metal line 40 on the board 10. The LED chip 21 is a semiconductor light-emitting element according to the present invention and is a bare chip that emits monochromatic visible light in this embodiment. The LED chip 21 is die bonded by a die attach material 70 (die bond material) formed on the metal line 40.

In this embodiment, a blue LED chip that emits blue light is used as the LED chip 21. For example, a gallium nitride-based semiconductor light-emitting element having a center wavelength from 450 nm to 470 nm which is made of an InGaN-based material can be used as the blue LED chip. Note that the LED chip 21 in this embodiment is a chip that emits light in all directions, that is, to the sides, up, and down. For example, 20% of the total amount of light is emitted to the sides, 60% of the total amount of light is emitted upward, and 20% of the total amount of light is emitted downward.

\<Others\>

As shown in FIG. 2, both a p-side electrode 21a and an n-side electrode 21b of the LED chip 21 are formed on the upper side of the LED chip 21 in this embodiment. The p-side electrode 21a and the n-side electrode 21b are electrically connected to the wire 60 by the metal line 40 and wire bonding. For example, a gold wire can be used as the wire 60.

Furthermore, although not illustrated, power terminals are provided on the board 10 to supply power to the metal line 40. The LED chip 21 is powered through the metal line 40 and the wire 60 as power is supplied from an external power source to the power terminal. With this, an active layer of the LED chip 21 emits light and desired light is emitted.

Next, the light-emitting device 100 according to this embodiment is further described in detail with reference to FIG. 2.

As shown in FIG. 2, in this embodiment, it is preferable that $0 < h2/h1 \leq 1$ be satisfied, when the height of the phosphor-containing resin 22 (light-emitting part) is denoted by h1 and the height of the light-guiding member 30 is denoted by h2. With this, the light which exits the light-emitting part 20 incidents on the light-guiding member 30, and a light-emitting area in appearance increases. Thus, contrast with an adjacent light-emitting part 20 decreases. As a result, grainy texture in the longer direction is suppressed and luminance uniformity is improved.

Furthermore, it is preferable that at least an end portion of the light-guiding member 30 on the side of the LED chip 21 be on the side of the LED chip 21 with respect to a normal VL that extends from (i) an intersection between the board 10 and the outline of the light-emitting part 20 or (ii) an intersection between the board 10 and an extension of the outline. The phosphor-containing resin 22 is not in contact with the board 10 in FIG. 2. Thus, the normal VL is a vertical line with respect to the board 10 on the intersection between the board 10 and a curve line that is obtained by extending an outline of the phosphor-containing resin 22 toward the board 10.

With this configuration, an appropriate balance in an amount of light is achieved between the light directly emitted from the light-emitting part 20 and the light emitted through the light-guiding member 30, and thus luminance uniformity can be improved.

Furthermore, the phosphor-containing resin 22 is scaled down to reduce optical losses in the phosphor-containing resin 22 in this embodiment. With this, the wire 60 is exposed from the phosphor-containing resin 22 as shown in FIG. 2. In this embodiment, the wire 60 exposed from the phosphor-containing resin 22 is covered by the light-guiding member 30 and is buried in the light-guiding member 30. Therefore, the wire 60 can be protected by the light-guiding member 30. In other words, this embodiment provides a configuration which allows for high light extraction efficiency and the protection of the wire. Note that cost-cutting can be achieved because the amount of the phosphor-containing resin 22 used can be reduced by scaling down the phosphor-containing resin 22.

The thus described light-guiding member 30 can be formed by sealing the LED chip 21 with the phosphor-containing resin 22 and then potting a material of the light-guiding member 30 from above the side portion of the phosphor-containing resin 22.

Note that a metal base board made of aluminum is used as the board 10 in this embodiment. Furthermore, an insulating film made of an organic material such as polyimide is used as the insulating film 11. The resist 80 is formed on the board 10 to allow light to be reflected toward the upper surface (light extraction surface) and is made of a white resin. The metal line 40 is made of thin film copper (Cu). The surface of the metal line 40 is plated. In this embodiment, the surface of the metal line 40 is covered by plating 41 including silver (Ag) or gold (Au).

As described, the light-emitting device 100 according to this embodiment includes the light-guiding member 30. Thus, it is possible to guide the light from the light-emitting part 20 to the light-guiding member 30 and allow the light to propagate in the light-guiding member 30. Thus, the white light emitted to the outside from the light-emitting device 100 consists of the white light that the light-emitting part 20 emits to the outside directly and the white light that the light-emitting part 20 emits to the outside via the light-guiding member 30. Therefore, the light emitting region in appearance in the light-emitting device can be expended to include the light-guiding member 30 in addition to the light-emitting part 20. As a result, it is possible to reduce the grainy texture and suppress the color unevenness and the luminance unevenness. Particularly, when the light-emitting part 20 and the light-guiding member 30 are formed along the elongated direction of the board 10, the color unevenness and the luminance unevenness in the elongated direction can be suppressed and the luminance uniformity in the elongated direction can be improved.

Figure 3A:
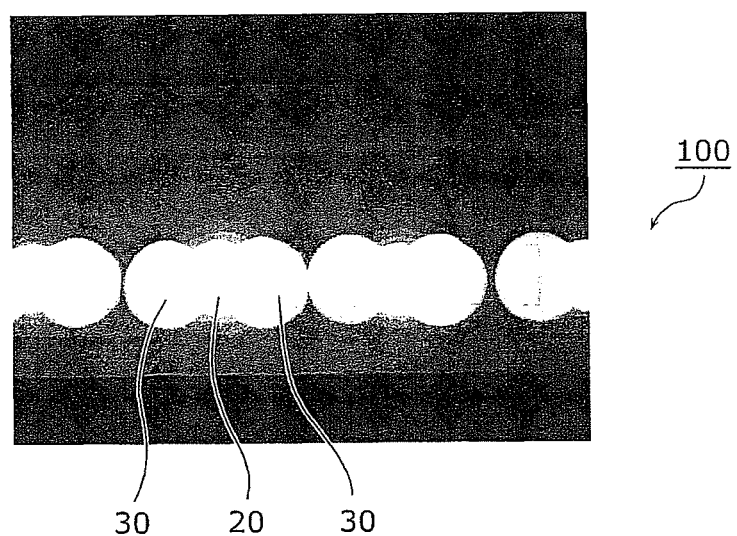
FIG. 3A is a photograph of an external appearance of the light-emitting device, which is emitting light, according to Embodiment 1 of the present invention.
Figure 3B:
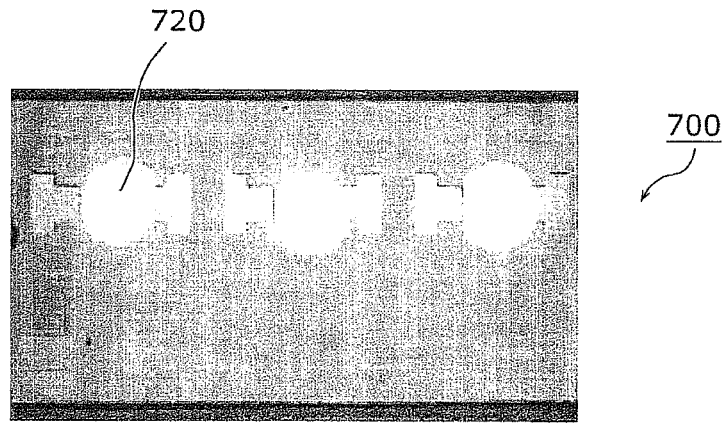
FIG. 3B is a photograph of an external appearance of a light-emitting device, which is emitting light, according to a comparative example.
Figure 10A:
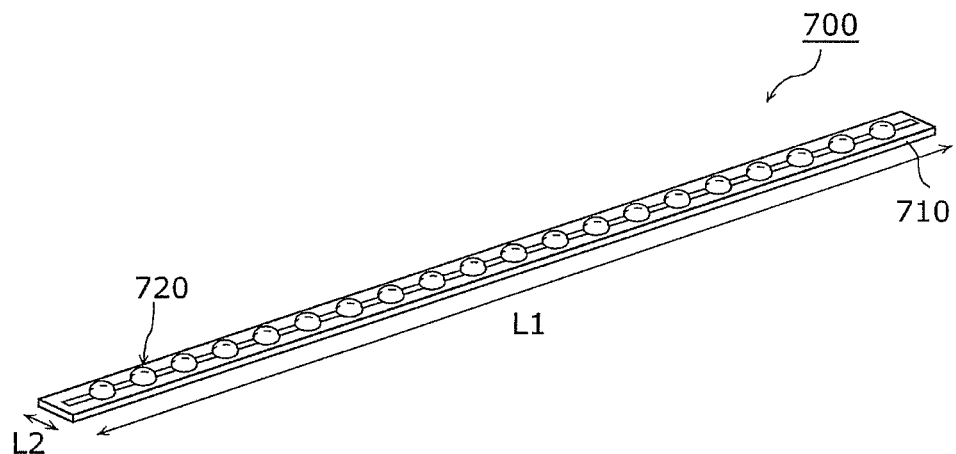
FIG. 10A is an external perspective view showing an example of a light-emitting device (comparative example).
Figure 10B:
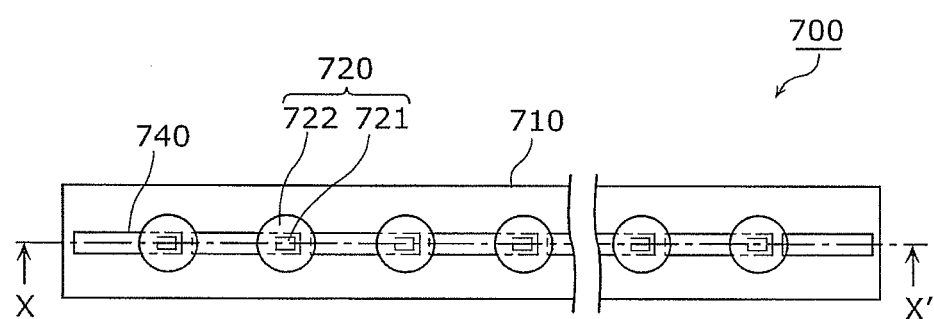
FIG. 10B is a plan view showing an example of the light-emitting device (comparative example).
Figure 10C:
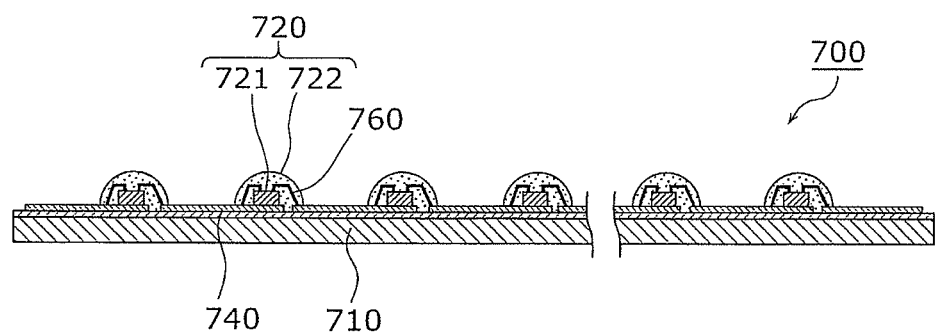
FIG. 10C is a cross-sectional view (cross-sectional view taken along line X-X' in FIG. 10B) showing an example of the light-emitting device (comparative example).

Here, suppression of the grainy texture on the light-emitting device 100 according to this embodiment is described with reference to FIG. 3A and FIG. 3B. FIG. 3A is a photograph of an external appearance of the light-emitting device, which is emitting light, according to Embodiment 1 of the present invention. FIG. 3B is a photograph of an external appearance of a light-emitting device 700, which is emitting light, according to a comparative example shown in FIG. 10A to FIG. 10C.

FIG. 3A shows that the light-emitting device 100 according to Embodiment 1 of the present invention emits white light from the light-emitting part 20 and the light-guiding member 30. In contrast, as shown in FIG. 3B, the light-emitting device 700 according to the comparative example emits white light only from the light-emitting part 720.

Comparison between FIG. 3A and FIG. 3B shows that the light emitting region of the light-emitting device 100 according to Embodiment 1 of the present invention shown in FIG. 3A is larger than the light emitting region of the light-emitting device 700 according to the comparative example shown in FIG. 3B. Furthermore, it is shown that the non-light emitting region, which is the non-light-emitting part (other than the light-emitting part 720) of the light-emitting device 700 according to the comparative example shown in FIG. 3B, is turned into the light emitting region in the light-emitting device 100 according to Embodiment 1 of the present invention shown in FIG. 3A. With this, in FIG. 3B according to the comparative example, the light-emitting part 20 and the non-light-emitting part are alternated in the longer direction of the board, giving the grainy texture. In contrast, in FIG. 3A according to the present invention, the region between the light-emitting parts 20 which are adjacent to each other, which was the non-light-emitting part, is turned into the light emitting region. Since the light emitting regions are continuously present in the longer direction of the board, the grainy texture is suppressed.

Note that, referring back to FIG. 1A and FIG. 1B, it is preferable that $0 \leq D1/L1 \leq L1/2n$ be satisfied, when the distance between the light-guiding members 30 which are adjacent to each other in the non-light-emitting part is denoted by D1, the number of the LED chips 21 mounted on the board 10 is denoted by n, and the longer direction of the board is denoted by L1. With this, grainy texture can be further reduced. On the other hand, when it is assumed that n LED chips are mounted at even intervals on the mounting board (length L1 in the longer direction), the distance D1 between the adjacent light-guiding members 30 is greater than the light-emitting part 20, when D1/L1 exceeds L1/2n. As a result, an effect in reducing the grainy texture is small. Further, a trouble may occur, that is, white light incidents on the adjacent phosphor-containing resin 22 and re-excite the phosphor to cause a color shift from the desired luminescent color.

Furthermore, according to the configuration in this embodiment, the light-guiding member 30 covers part of the phosphor-containing resin 22 and is in contact with the light-emitting part 20 (the phosphor-containing resin 22). However, the present invention is not limited to this. For example, the light-guiding member 30 may be provided in the non-light-emitting part between the adjacent light-emitting parts 20 so as not to be in contact with the light-emitting part 20. For example, the light-emitting parts 20 and the light-guiding members 30 may be alternately provided along the longer direction of the board 10 with a space apart from one another. Such arrangement of the light-guiding member 30 also allows the light emitted from the light-emitting part 20 to be guided to the light-guiding member 30. With this, the region other than the light-emitting part 20 can be turned into the light emitting region, and the grainy texture can be reduced. Note that it is preferable in this case that both end surfaces of the light-guiding member 30 on the side of the light-emitting part 20 be arranged to face the light-emitting part 20.

However, when the light-guiding member 30 is configured according to this embodiment, that is, the light-guiding member 30 covers part of the phosphor-containing resin 22 and is in contact with the light-emitting part 20 (the phosphor-containing resin 22), it is easier for the light that exits the light-emitting part 20 to incident on the light-guiding member 30. As the light-emitting area in appearance is expanded, the contrast with the adjacent light-emitting part 20 can be decreased. As a result, the grainy texture can be reduced effectively.

Furthermore, according to the configuration of this embodiment, the light-emitting part 20 and the light-guiding member 30 are alternately arranged along the longer direction of the board 10 in a manner such that the portions opposing each other is in contact with each other. Compared with the arrangement where the light-emitting part 20 and the light-guiding member 30 are arranged with a space apart from each other, this configuration allows the light from the light-emitting part 20 to be guided to the light-guiding member 30 easily. Thus, optical losses between the light-emitting part 20 and the light-guiding member 30 can be suppressed. Furthermore, the light which exits the light-emitting part 20 is guided into the light-guiding member 30 to be connected in the longer direction of the board 10 through the portion where the light-emitting part 20 and the light-guiding member 30 are in contact with each other. As a result, the light emitting region can be expanded and light-emission luminance can be improved.

In the light-emitting device 100 according to this embodiment, the light-emitting part 20 and the light-guiding member 30 are not simply in contact with each other. Only side portions of the phosphor-containing resin 22, which is formed to have a dome shape, are covered by the light-guiding member 30. Thus, the light-guiding member 30 is formed on a portion where the optical path length is long in the phosphor-containing resin 22. Thus, the color unevenness (color separation) can be reduced.

Embodiment 2

Figure 4A:
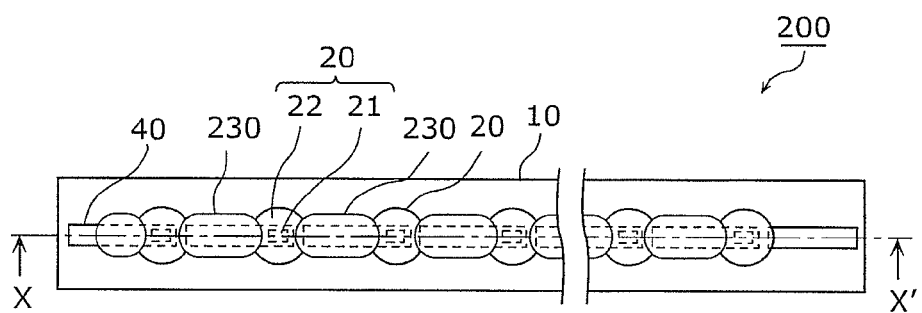
FIG. 4A is a plan view of a light-emitting device according to Embodiment 2 of the present invention.
Figure 4B:
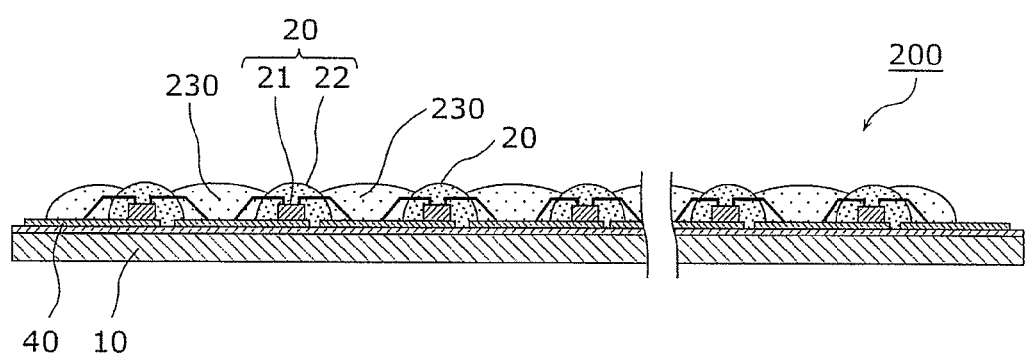
FIG. 4B is a cross-sectional view of the light-emitting device (cross-sectional view taken along the line X-X' in FIG. 4A) according to Embodiment 2 of the present invention.

Next, a light-emitting device 200 according to Embodiment 2 of the present invention is described with reference to FIG. 4A and FIG. 4B. FIG. 4A is a plan view of a light-emitting device according to Embodiment 2 of the present invention. FIG. 4B is a cross-sectional view of the light-emitting device according to Embodiment 2 of the present invention taken along the line X-X' in FIG. 4A.

The basic configuration of the light-emitting device 200 according to Embodiment 2 of the present invention is the same as the light-emitting device 100 according to Embodiment 1 of the present invention. FIG. 4A and FIG. 4B correspond to FIG. 1B and FIG. 1C, respectively. In FIG. 4A and FIG. 4B, the components identical to the components shown in FIG. 1B and FIG. 1C are denoted by the same reference signs, and the detailed descriptions thereof are omitted.

The light-emitting device 200 according to Embodiment 2 of the present invention shown in FIG. 4A and FIG. 4B is different from the light-emitting device 100 according to Embodiment 1 of the present invention shown in FIG. 1B and FIG. 1C in the configuration of the light-guiding member.

As shown in FIG. 4A and FIG. 4B, a light-guiding member 230 in the light-emitting device 200 according to Embodiment 2 of the present invention is formed to connect the light-emitting parts 20 which are adjacent to each other. In this embodiment, the distance between the adjacent light-emitting parts 20 is greater than the length of each of the light-emitting parts 20 in the longer direction of the board. Accordingly, the light-guiding member 230 is formed to have an elongated shape. Furthermore, the light-guiding member 230 is formed such that the length (width) of the light-guiding member 230 in the shorter direction of the board is approximately equal to the length of each of the light-emitting parts 20 in the shorter direction of the board. With this, the light-emitting part 20 and the light-guiding member 230 form a linear line along the longer direction of the board 10.

Furthermore, the light-guiding member 230 is formed such that the both end portions of the light-guiding member 230 between the light-emitting parts 20 cover part of the light-emitting part 20 on the side of the light-guiding member 230. The thus described light-guiding member 230 can be formed by forming the light-emitting parts 20 and then covering part of each of the adjacent light-emitting parts 20 with the light-guiding member 230 in such a manner that the adjacent light-emitting parts 20 are bridged. Note that the light-guiding member 230 is formed to have an upwardly convex dome shape as shown in FIG. 4B.

As described, in the light-emitting device 200 according to Embodiment 2 of the present invention, the light-guiding member 230 is provided to bury the non-light-emitting part between the adjacent light-emitting parts 20 in the longer direction of the board. With this, the light from the light-emitting parts 20 on both sides is guided to the light-guiding member 230 and propagates in the light-guiding member 230. Thus, the light emitting region can be formed continuously without a gap in the longer direction of the board. With this, the light emitting region can be expanded without having the non-light-emitting part between the adjacent light-emitting parts 20. Therefore, compared with Embodiment 1, it is possible to further reduce grainy texture, and further suppress color unevenness and luminance unevenness. Thus, luminance uniformity in the elongated direction can be further improved.

Note that in this embodiment, too, the light-guiding member 230 covers only side portions of the dome-shaped phosphor-containing resin 22 as described above. With this, the light-guiding member 230 is formed on a portion having a long optical path length in the phosphor-containing resin 22. Thus, it is also possible to reduce the color unevenness (color separation).

Embodiment 3

Figure 5A:
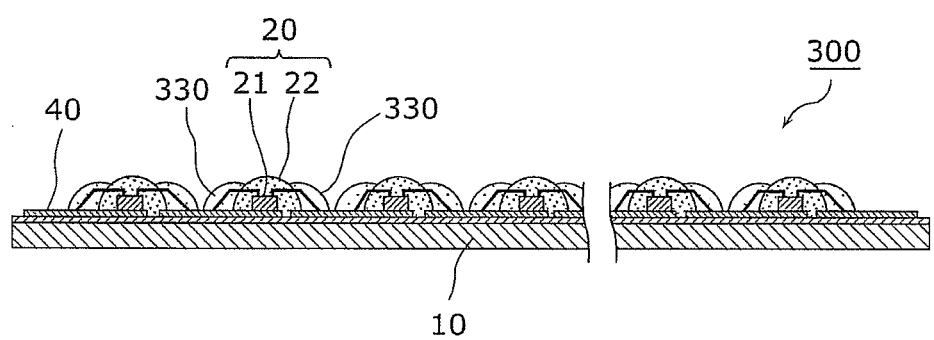
FIG. 5A is a cross-sectional view of a light-emitting device according to Embodiment 3 of the present invention.
Figure 5B:
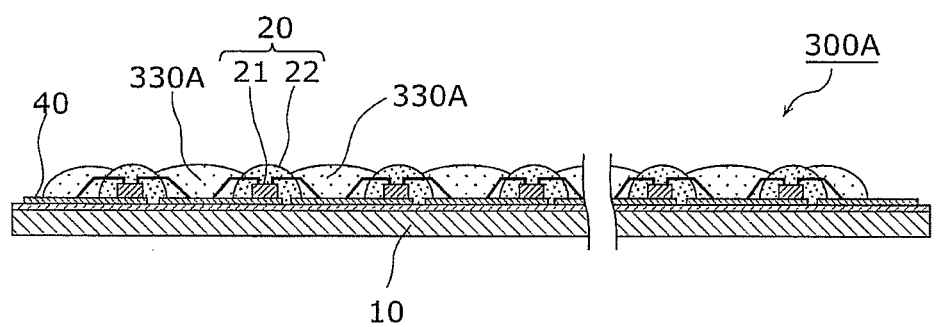
FIG. 5B is a cross-sectional view of a light-emitting device according to another example in Embodiment 3 of the present invention.

Next, a light-emitting devices 300 and 300A according to Embodiment 3 of the present invention are described with reference to FIG. 5A and FIG. 5B. FIG. 5A is a cross-sectional view of a light-emitting device according to Embodiment 3 of the present invention. FIG. 5B is a cross-sectional view of a light-emitting device according to another example in Embodiment 3 of the present invention.

First, the basic configuration of the light-emitting device 300 according to Embodiment 3 of the present invention shown in FIG. 5A is the same as the light-emitting device according to Embodiment 1 of the present invention. FIG. 5A corresponds to FIG. 1C. In FIG. 5A, the components identical to the components shown in FIG. 1C are denoted by the same reference signs, and the detailed descriptions thereof are omitted.

The light-emitting device 300 according to Embodiment 3 of the present invention shown in FIG. 5A is different from the light-emitting device 100 according to Embodiment 1 of the present invention shown in FIG. 1C in the configuration of the light-guiding member.

A light-guiding member 330 in the light-emitting device 300 according to Embodiment 3 of the present invention contains diffusion materials. In other words, in this embodiment, the light-guiding member 330 has a function of diffusing the light that is guided in the light-guiding member 330.

Thus, by adding the diffusion material to the light-guiding member 330, white light from the light-emitting part 20 propagating in the light-guiding member 330 can be redirected by the diffusion material contained in the light-guiding member 330. Thus, the white light propagating in the light-guiding member 330 can be diffused such that the white light travels toward the upper surface (light extraction surface).

With this, it is possible to cause the white light of the light-emitting part 20 to travel (i) in the horizontal direction of the board 10 by the light guide effect of the light-guiding member 330 and (ii) radially toward the front surface (light extraction surface) by the diffusion effect of the light-guiding member 330. Therefore, it is possible to reduce the grainy texture by expanding the light emitting region in appearance, and improve light extraction efficiency.

Furthermore, the basic configuration of the light-emitting device 300A according to another example in Embodiment 3 of the present invention shown in FIG. 5B is the same as the light-emitting device according to Embodiment 2 of the present invention. FIG. 5B corresponds to FIG. 4B. In FIG. 5B, the components identical to the components shown in FIG. 4B are denoted by the same reference signs, and the detailed descriptions thereof are omitted.

The light-emitting device 300A according to another example in Embodiment 3 of the present invention shown in FIG. 5B is different from the light-emitting device 200 according to Embodiment 2 of the present invention shown in FIG. 4B in the configuration of the light-guiding member.

A light-guiding member 330A in the light-emitting device 300A according to another example in Embodiment 3 of the present invention contains the diffusion material. In other words, in this embodiment, the light-guiding member 330A has a function of diffusing the light that is guided in the light-guiding member 330A, in the same manner as in FIG. 5A.

Thus, by adding the diffusion material to the light-guiding member 330A, the white light from the light-emitting part 20 propagating in the light-guiding member 330A can be redirected by the diffusion material contained in the light-guiding member 330A. Thus, the white light propagating in the light-guiding member 330A can be diffused such that the white light travels toward the upper surface (light extraction surface).

With this, it is possible to cause the white light of the light-emitting part 20 to travel (i) in the horizontal direction of the board 10 by the light guide effect of the light-guiding member 330A and (ii) radially toward the front surface (light extraction surface) by the diffusion effect of the light-guiding member 330A. Therefore, it is possible to reduce the grainy texture by expanding the light emitting region and improve the light extraction efficiency. Thus, the luminance can be improved.

Further, the light-guiding member 330A is provided to bury the non-light-emitting part between the adjacent light-emitting parts 20 in the longer direction of the board. With this, the light from the light-emitting part 20 is guided to the light-guiding member 330A. Thus, the light emitting region can be formed continuously without a gap in the longer direction of the board. With this, the light emitting region can be expanded without having the non-light-emitting part between the adjacent light-emitting parts 20. Thus, the grainy texture can be further reduced.

Note that the light-guiding member 330A covers only side portions of the dome-shaped phosphor-containing resin 22, in the same manner as in Embodiment 2. With this, the light-guiding member 330A is formed on a portion having a long optical path length in the phosphor-containing resin 22. Thus, it is also possible to reduce the color unevenness (color separation).

Furthermore, regarding the diffusion material contained in the light-guiding members 330 and 330A included in the light-emitting devices 300 and 300A according to Embodiment 3 of the present invention shown in FIG. 5A and FIG. 5B, respectively, it is preferable that density of the diffusion material on the side near the LED chip 21 be low and density of the diffusion material on the side far from the LED chip 21 be high. In other words, it is preferable that the density of the diffusion material in the light-guiding members 330 and 330A be higher as a distance from the LED chip 21 is greater. With this, it is possible to improve the luminance uniformity in the light-guiding member.

Embodiment 4

Figure 5C:
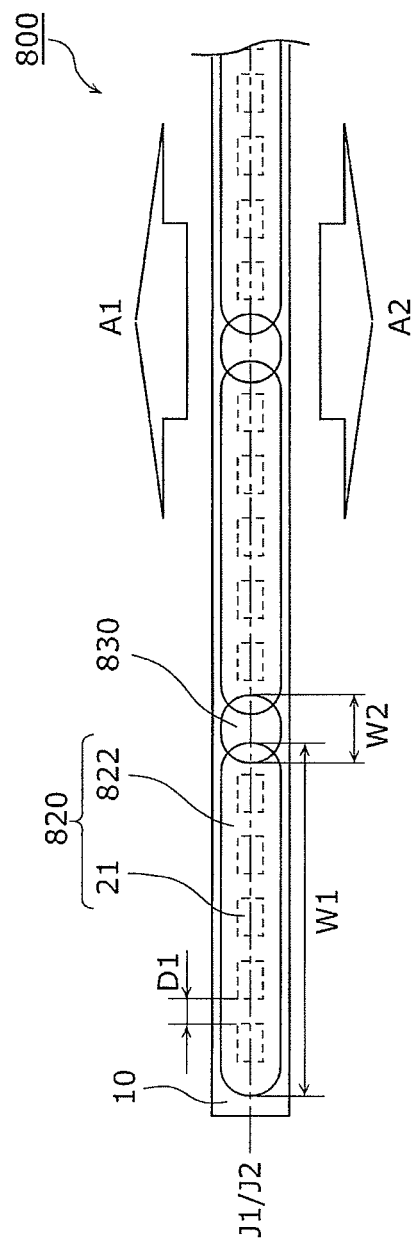
FIG. 5C is a plan view of a light-emitting device according to Embodiment 4 of the present invention.
Figure 5D:
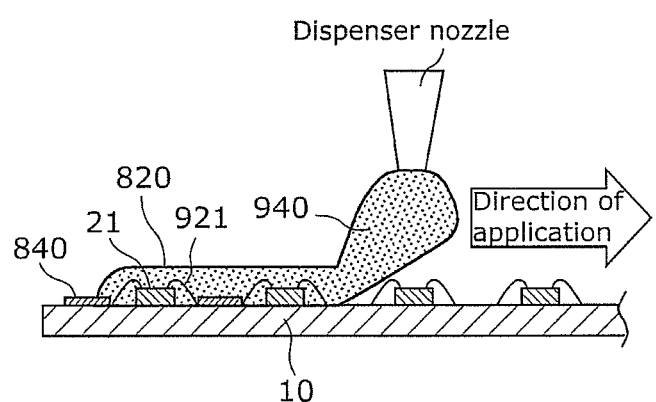
FIG. 5D is a cross-sectional view schematically showing manufacturing of the light-emitting device according to Embodiment 4 of the present invention.

Next, a light-emitting device 800 according to Embodiment 4 of the present invention is described with reference to FIG. 5C and FIG. 5D. FIG. 5C is a plan view of a light-emitting device according to Embodiment 4 of the present invention. Furthermore, FIG. 5D is a cross-sectional view schematically showing manufacturing of the light-emitting device according to Embodiment 4 of the present invention.

As shown in FIG. 5C, the basic configuration of the light-emitting device 800 according to this embodiment is the same as the light-emitting device according to any one of Embodiment 1 to Embodiment 3, but is different in that the light-emitting device 800 includes an elongated light-emitting part 820 in which a plurality of the LED chips 21 are collectively sealed with phosphor-containing resin 822. Note that the components in the light-emitting device 800 identical to the components in the aforementioned embodiments are denoted by the same reference signs, and the detailed descriptions thereof are omitted.

A plurality of the LED chips 21 is arranged regularly in a row to form an element row. Furthermore, the element rows are arranged on the board 10 along an axis, with a non-light emitting region formed between the element rows which are adjacent to each other. In this embodiment, five LED chips 21 are mounted to form a row. Note that the number of the LED chips 21 that form the element row is not particularly limited and may be set as appropriate based on the desired luminance and the like of the light-emitting device.

Each of the LED chips 21 is disposed linearly in the row direction (Y axis direction). The term linearly specifically refers to, for example, the state where the LED chips 21 are mounted with the center of each of the LED chips 21 within 30 μm with respect to an alignment axis J2 of the element row (an alignment axis defined by the center of each of the light-emitting devices in a plan view included in the element row).

When the LED chips 21 are linearly arranged as described, the phosphor-containing resin 822 which seals each of the LED chips 21 is likely to be formed linearly. Furthermore, the linear phosphor-containing resin 822 is easy to form and thus highly integrated light-emitting device 800 can be produced with high productivity.

As shown in FIG. 5C, it is preferable that the distance D1 between each of the LED chips 21 included in the element row be in a range from 0.8 mm to 3.0 mm, inclusive. With the distance smaller than this range, heat from the LED chip 21 may not be dissipated sufficiently. With the distance greater than this range, the adjacent LED chips 21 are spaced apart too far from each other and luminance unevenness may occur.

A central axis 31 along the longer direction of the phosphor-containing resin 822 coincides with the alignment axis J2 of the element row. In a state where the central axis 31 does not coincides with the alignment axis 32, emitted light A1 results in yellowish white light and emitted light A2 results in bluish white light. Thus, color unevenness of the emitted light may occur in a unit of the light-emitting part 820. In contrast, in a state where the central axis 31 coincides with the alignment axis 32 as this embodiment, both the emitted light A1 and the emitted light A2 likely to be white light.

Furthermore, when forming the elongated light-emitting part 820 including a plurality of the LED chips 21, it is preferable that (i) end portions of the phosphor-containing resin 822 in the longer direction be round and have a curvature, and (ii) the shape of the cross section along the shorter direction of the phosphor-containing resin 822 be substantially semi-elliptical.

When the end portions in the longer direction of the phosphor-containing resin 822 are round as described above, stress concentration is less likely to occur in the end portions. Furthermore, the distance from the LED chip 21 provided on the side of end portion of the element row to the end portion of the phosphor-containing resin 822 is substantially uniform in all directions. This makes it easy to extract the light emitted from the LED chip 21 to the outside of the phosphor-containing resin 822.

Note that, although not illustrated, a land is provided in each of end portions of the surface of the board 10, and the lands form a pair. A pair of lead wires of a lighting circuit unit is connected to the pair of the lands. Power is supplied to each of the LED chips 21 from the lighting circuit unit through the lead wires and thus each of the LED chips 21 emits light.

As described above, in the light-emitting device 800, a plurality of the LED chips 21 that form the element row are collectively sealed with the elongated phosphor-containing resin 822. With this configuration, it is possible to improve productivity compared to the case where all the LED chips 21 are individually sealed with the phosphor-containing resin (sealing material) 822. On the other hand, when a plurality of the LED chips 21 are collectively sealed, heat builds up locally and color unevenness and the like may occur. However, by providing a curvature in end portion of the elongated phosphor-containing resin 822 as described above, heat is dissipated substantially uniformly even when heat is generated by the LED chips 21. Thus, reduction in luminance of the LED chips 21 and decrease in excitation efficiency of the phosphors due to local over temperature are less likely to occur. As a result, the light-emitting device 800 is less likely to have luminance unevenness and color unevenness.

Furthermore, when localized high temperature is generated in the phosphor-containing resin 822, amount of expansion varies from portion to portion. This increases internal stress causing a crack and the like, and results in a decreased sealing reliability. In this regard, in the light-emitting device 800 according to this embodiment, the phosphor-containing resin 822 is formed along the element row. Then, the phosphor-containing resin 822 mainly expands and contracts in the direction along the element row. Thus, internal stress is less likely to increase and the sealing reliability is less likely to decrease.

With an object to further reduce the grainy texture and suppress color unevenness and the like of the light-emitting device 800, when the width of the light-emitting part 820 along the longer direction of the board 10 is denoted by W1, the width of a light-guiding member 830 that covers the non-light emitting region is denoted by W2, the distance between each of the adjacent LED chips 21 that form the element row is denoted by D1, and the number of the LED chips mounted in the light-emitting part 820 is denote by N (for example, in this embodiment, the number of LED chips are five and thus N=5), it is preferable that the following two expressions (a) and (b) be satisfied.

$$(1/N) \leq W2/W1 \leq (3/N) \quad \text{(a)}$$

$$D1 \leq W2 \quad \text{(b)}$$

When both of the above-described two expressions (a) and (b) are satisfied simultaneously, sufficient light can be guided to the light-guiding member from the LED chips 21 disposed in both end portions in the phosphor-containing resin 822. With this, the light emitting region can be expanded without having non-light-emitting part. As a result, it is possible to further suppress luminance unevenness between the adjacent light-emitting parts 820.

On the other hand, when W2/W1 in the above expression (a) exceeds the upper limit 3/N, a light-guiding distance of the light of the LED chip disposed on each end portion in the phosphor-containing resin 822 is large and thus the light is not sufficiently guided. Therefore, effect in suppressing luminance unevenness between adjacent light-emitting parts 820 is small and thus not desirable. On the other hand, when W2/W1 is smaller than the lower limit 1/N, the space W2 between the adjacent light-emitting parts 820 is small, and luminance unevenness is not likely to occur. As a result, it is unnecessary to dispose the light-guiding member and thus not desirable.

Furthermore, when it is D1>W2 in the above-described expression (b), luminance unevenness between the adjacent light-emitting parts 820 is not likely to occur, as with the case where the W2/W1 is smaller than the lower limit 1/N. As a result, it is unnecessary to dispose the light-guiding member and thus not desirable.

<Method for Forming Elongated Light-Emitting Part>

The elongated phosphor-containing resin 822 for collectively sealing a plurality of the LED chips 21 can be formed easily by using a dispenser.

In this embodiment, as shown in FIG. 5D, the board 10 on which the element row, which includes a plurality of the LED chips 21 that are arranged to form a row, is mounted is first prepared. A line pattern 840 is formed on the board 10.

Next, resin paste 940 is applied from a dispenser nozzle along the element row to form a line so that each of the LED chips 21 which forms the element row is covered. After the application, the resin paste 940 is solidified. The method of solidification is not particularly limited. The solidification may be accomplished using an oven set at a temperature optimal for the solidification of the resin paste 940 to be used or through natural drying. The elongated light-emitting part that includes LED chips 21 is formed by solidifying the resin paste 940 as described.

When the amount of the resin paste 940 applied varies, the shape of the phosphor-containing resin also varies. This leads to variation in the amount of phosphors distributed in the vicinity of the LED chip 21 and, as a result, often cause the color unevenness and the like. Thus, it is preferable that the resin paste 940 be dispensed at high quantitative accuracy and be applied within the error range of 0.5 mg per single elongated phosphor-containing resin. Note that the elongated phosphor-containing resin may be formed using a mold. In this case, positional accuracy of the mold with respect to the board 10 is also important in addition to the quantitative accuracy, and a positioning within the error range of 80 μm is preferable.

To stably form the phosphor-containing resin 22 without involving deformation and the like, it is preferable that the viscosity of the material of the phosphor-containing resin 22, i.e. the resin paste 940, be in the range of 20 to 60 [Pa·sec.]. With the viscosity within the optimal viscosity range, the round shape at each end of the phosphor-containing resin in the longer direction and the substantially semi-elliptical shaped cross section along the shorter direction can be easily achieved. Furthermore, with the resin paste 940 having high viscosity near 60 [Pa·sec.], it is hard for the phosphors contained in the resin paste 940 to settle and thus the light emitted from the light-emitting part 820 is less likely to have color unevenness.

In contrast, for example, when the viscosity is not within the above-described range and is less than 20 [Pa·sec.], it is highly likely that the shape of the resin paste 940 collapses immediately after the application of the resin paste 940, making it difficult to form the phosphor-containing resin of a designed shape. When the phosphor-containing resin 22 is not in the designed shape, a problem in terms of performance occurs, such as color unevenness of the light emitted from the light-emitting part 820. Besides this, a problem in terms of sealing reliability can occur, such as wire 921 and the like included in the elongated light-emitting part being exposed out of the phosphor-containing resin. Furthermore, when the viscosity is higher than the above-described range, application can be difficult as resistivity of the resin paste 940 inside the dispenser nozzle can be too high.

To make the viscosity of the resin paste 940 suitable, it is preferable that the resin paste 940 contains filler or the phosphor at least 5 wt %. For example, white filler can be used as the filler. Furthermore, to maintain the phosphor-containing resin in a suitable shape, it is preferable that a Shore A hardness of the phosphor-containing resin be 20 or greater.

Embodiment 5

The following describes, based on Embodiment 5 to Embodiment 7, examples of application of the light-emitting device according to any one of Embodiment 1 to Embodiment 4 of the present invention.

Figure 6:
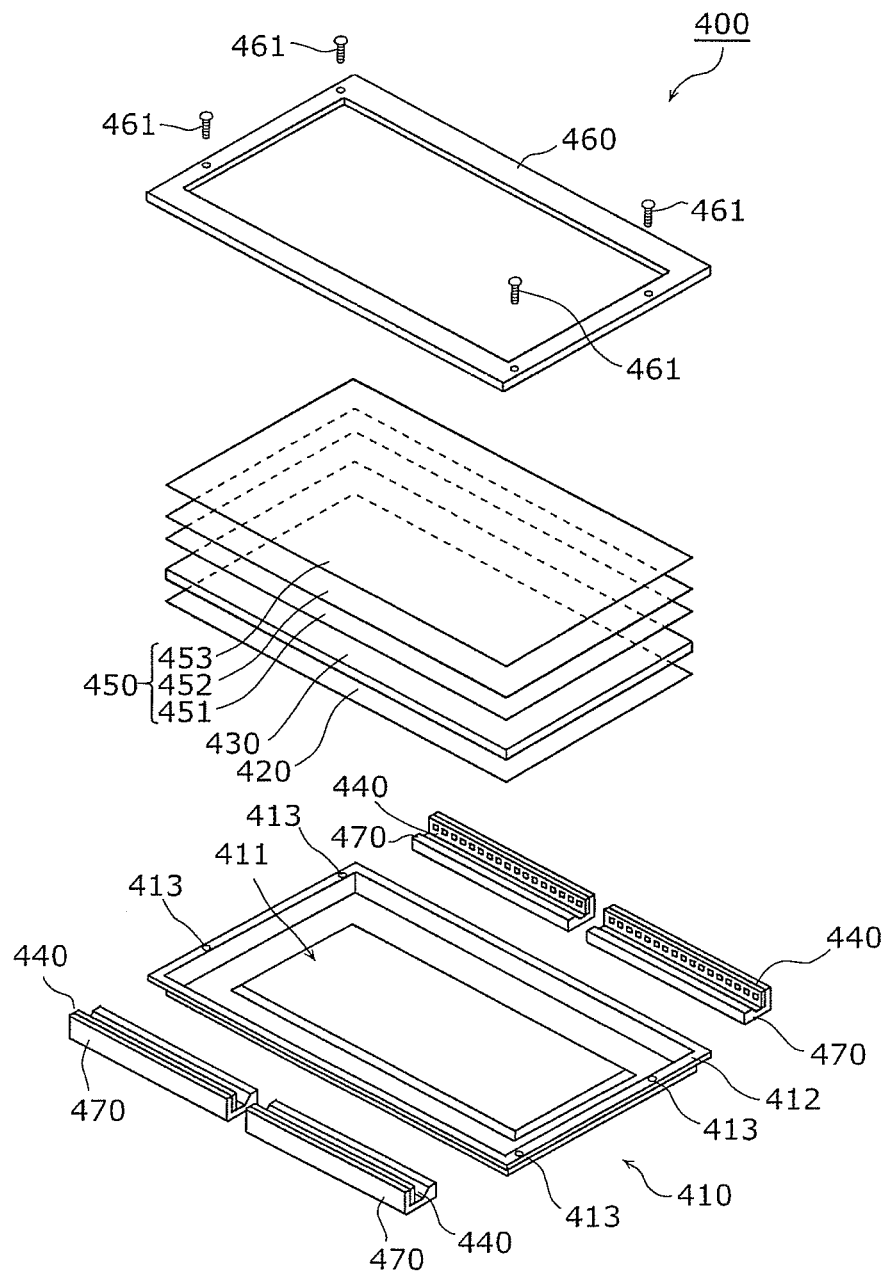
FIG. 6 is an exploded perspective view of a backlight unit according to Embodiment 5 of the present invention.

First, an example where the light-emitting device according to any one of Embodiment 1 to Embodiment 4 of the present invention is applied to a backlight unit of a liquid crystal display apparatus is described with reference to FIG. 6. FIG. 6 is an exploded perspective view of a backlight unit according to Embodiment 5 of the present invention.

As shown in FIG. 6, a backlight unit 400 according to Embodiment 5 of the present invention is an edge-lit backlight unit in which light sources are disposed on the sides of a light-guiding plate. The backlight unit 400 includes: a casing 410, a reflector sheet 420, a light-guiding plate 430, a light-emitting device 440, optical sheets 450, and a front frame 460.

The casing 410 has a flat box-like shape and is formed by pressing a plate made of stainless steel and the like. The casing 410 has an opening 411 in the bottom. A flange 412 is formed in the periphery of the opening of the casing 410. Screw holes 413 for fastening the front frame 460 are formed on the flange 412.

The reflector sheet 420 is, for example, a sheet made of polyethylene terephthalate (PET) and reflects white light from the light-emitting device to allow the white light to be transmitted into the light-guiding plate 430.

The light-guiding plate 430 is, for example, a sheet made of polycarbonate (PC) and acrylic. On the main surface (back surface) that is on the side of reflector sheet 420 and is opposite to the light-emitting surface (front surface), a dot pattern is printed. The dot pattern is a lighting element for causing the light which incidents on the light-guiding plate 430 to diffuse so that the light is emitted from the light-emitting surface. The lighting element used is: light scattering element such as a light scattering structure and a prism shape formed on the back surface of the light-guiding plate 430 by printing, molding, and the like; or light scattering element and the like that is formed within the light-guiding plate 430.

The optical sheets 450 include: a diffuser sheet 451, a prism sheet 452, and a light-polarizing sheet 453. All the sheets are in the same size and have the same shape of planer shape (rectangular shape). The diffuser sheet 451 is, for example, a film made of PET and a film made of PC. The prism sheet 452 is, for example, a sheet made of polyester. A regular prism pattern is formed with acrylic resin on one side of the prism sheet 452. The light-polarizing sheet 453 is, for example, a film made of polyethylene naphthalate.

The front frame 460 is fixed to the flange 412 of the casing 410 by screwing the screws 461 into the screw holes 413 on the casing 410. The front frame 460 and the casing 410 sandwich the light-guiding plate 430 and the optical sheets 450.

The light-emitting device 440 is a light-emitting device according to any one of the above-described Embodiment 1 to Embodiment 4 of the present invention. This embodiment includes four light-emitting devices each of which is provided on a corresponding one of heat sinks 470. The light-emitting device 440 provided on the heat sink 470 is disposed such that the light-emitting surface faces the side surface of the light-guiding plate 430.

The heat sink 470 holds the light-emitting device 440 and is made of, for example, an L-shaped drawn material (angle) made of aluminum. The heat sink 470 is fixed to the casing 410 with screws and the like.

As described above, the backlight unit 400 according to Embodiment 5 of the present invention employs the light-emitting device according to any one of Embodiment 1 to Embodiment 4 of the present invention. Thus, it is possible to provide the backlight unit which is free from color unevenness and luminance unevenness, and has high light extraction efficiency.

Embodiment 6

Figure 7:
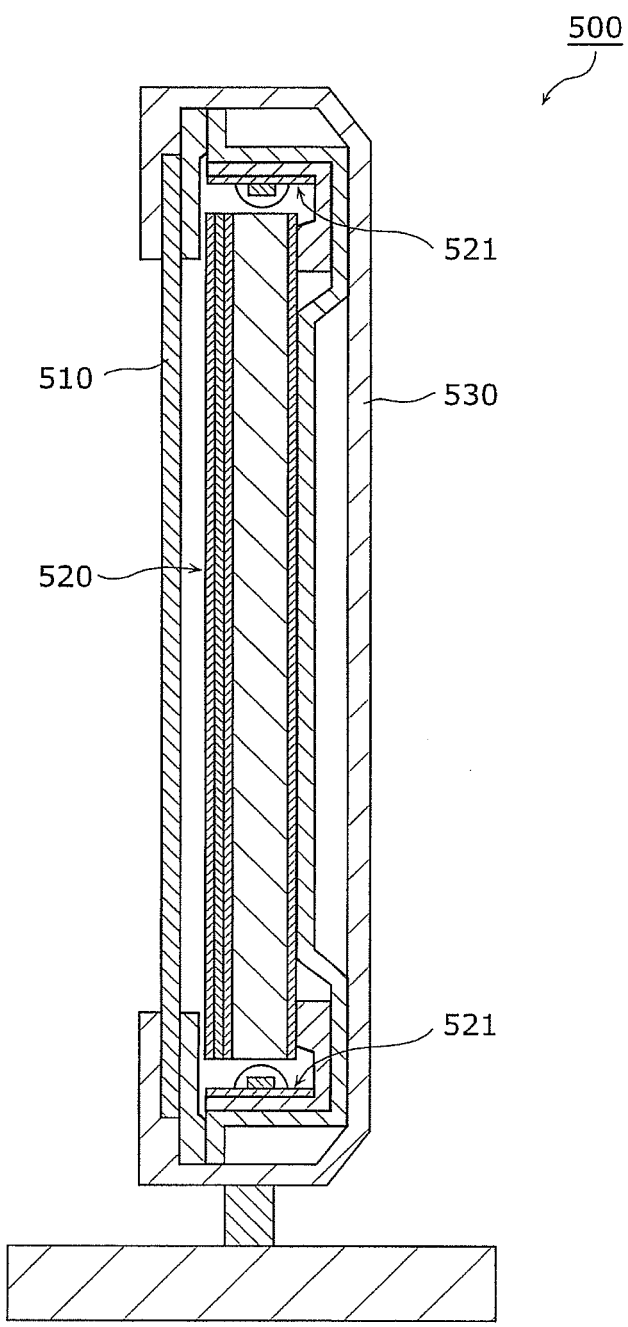
FIG. 7 is a cross-sectional view of a liquid crystal display apparatus according to Embodiment 6 of the present invention.

Next, an example where the light-emitting device according to any one of Embodiment 1 to Embodiment 4 of the present invention is applied to a liquid crystal display apparatus is described with reference to FIG. 7. FIG. 7 is a cross-sectional view of a liquid crystal display apparatus according to Embodiment 6 of the present invention.

As shown in FIG. 7, a liquid crystal display apparatus 500 according to Embodiment 6 of the present invention is, for example, a liquid crystal display television and a liquid crystal display monitor. The liquid crystal display apparatus 500 includes: a liquid crystal display panel 510, a backlight unit 520 disposed behind the liquid crystal display panel 510, and a housing 530 which houses the liquid crystal display panel 510 and the backlight unit 520.

The backlight unit 520 in this embodiment employs the backlight unit according to the above-described Embodiment 4 of the present invention. Furthermore, the backlight unit 520 includes a light-emitting device 521 which includes LEDs. The light-emitting device 521 employs the light-emitting device according to any one of Embodiment 1 to Embodiment 4 of the present invention.

As described above, the liquid crystal display apparatus 500 according to Embodiment 5 of the present invention employs the backlight unit 520 which is free from color unevenness and luminance unevenness, and has high light extraction efficiency. Thus, a liquid crystal display apparatus having high contrast and high luminance can be provided.

Embodiment 7

Figure 8:
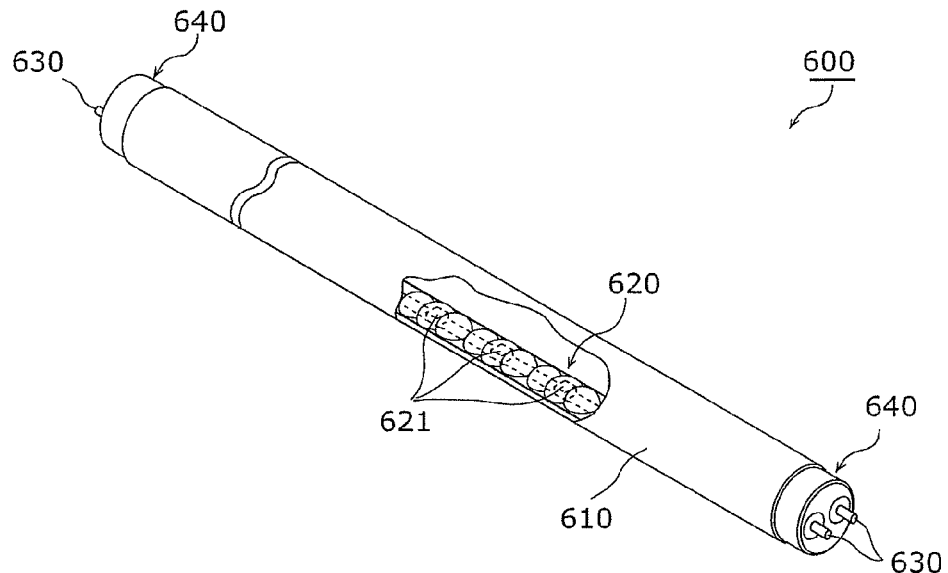
FIG. 8 is a cross-sectional view of a lighting apparatus according to Embodiment 7 of the present invention.

Next, an example where the light-emitting device according to any one of Embodiment 1 to Embodiment 4 of the present invention is applied to a lighting apparatus is described with reference to FIG. 8. FIG. 8 is a cross-sectional view of a lighting apparatus according to Embodiment 7 of the present invention.

A lighting apparatus 600 according to Embodiment 7 of the present invention is a linear tube LED lamp which includes the light-emitting device according to any one of Embodiment 1 to Embodiment 3 of the present invention and is a linear fluorescent lamp used for general lighting as shown in FIG. 8.

The lighting apparatus 600 according to this embodiment includes: an elongated glass tube 610; a light-emitting device 620 disposed within the glass tube 610; a pair of base pins 630; bases 640 attached to each end of the glass tube 610; an adhesive material (not illustrated) which joins (fixes) the light-emitting device 620 to the glass tube 610 in contact with each other; and a lighting circuit (not illustrated) which causes LED chips 621 of the light-emitting device 620 to emit light when power is supplied via the bases 640.

As described above, the lighting apparatus 600 according to Embodiment 7 of the present invention employs the light-emitting device according to any one of Embodiment 1 to Embodiment 4 of the present invention. Thus, a lighting apparatus of high illuminance can be provided.

(Variation)

Figure 9A:
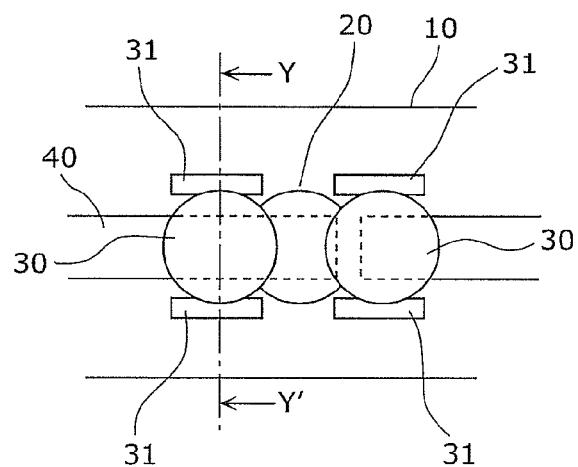
FIG. 9A is a plan view of a light-emitting device according to a variation of the present invention.
Figure 9B:
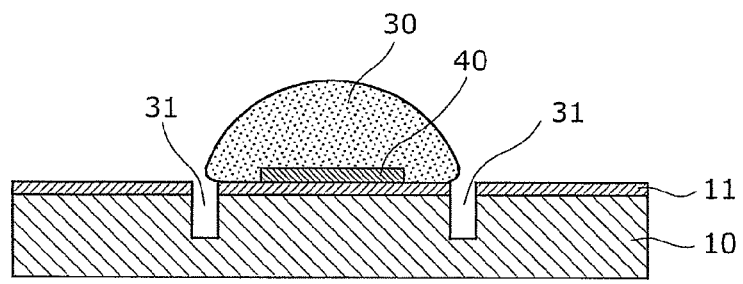
FIG. 9B is a cross-sectional view (cross-sectional view taken along the line Y-Y' in FIG. 9A) of the light-emitting device according to the variation of the present invention.

The following describes with reference to FIG. 9A and FIG. 9B a variation of the light-emitting device according to the above-described embodiments of the present invention. FIG. 9A is a plan view of a light-emitting device according to a variation of the present invention. FIG. 9B is a cross-sectional view of the light-emitting device according to the variation of the present invention taken along the line Y-Y' in FIG. 9A.

As shown in FIG. 9A and FIG. 9B, the light-emitting device according to the variation of the present invention includes grooves 31 formed on the board. Each of the grooves 31 is formed to regulate the end portion position of the light-guiding member 30. In this variation, each of the grooves 31 is formed by removing the insulating film 11 and a portion of the board 10. Furthermore, as shown in FIG. 9A, the plan shape of the groove 31 is a rectangular shape with its long side that lies in the direction of the long side of the board is longer than the short side that lies in the short side direction of the board.

With the groove 31 that is formed on the board 10 as described above, the end portion of the light-guiding member 30 is regulated by the edge of the groove 31 due to surface tension as shown in FIG. 9B, when the light-guiding member 30 having high thixotropy is applied. Thus, it is possible to control the width of the light-guiding member 30. Furthermore, as the end portion of the light-guiding member 30 is regulated by the surface tension, it is also possible to form the light-guiding member 30 into the desired dome shape.

Note that, in this variation, a pair of grooves 31 that face each other is formed so as to sandwich the region on which the light-guiding member 30 is formed. With this, positions of the light-guiding member 30 on each side facing the long sides of the board 10 are regulated. Thus, the light-guiding member 30 of the predetermined shape can be formed in the predetermined region.

As described above, the light-emitting device according to this variation includes the board 10 on which the grooves 31 are formed. Thus, the light-guiding member 30 can be formed easily in the predetermined region in the predetermined shape.

The light-emitting device, the backlight unit, the liquid crystal display apparatus, and the lighting apparatus according to the present invention have been described thus far based on the embodiments. However, the present invention is not limited to such embodiments.

For example, in the above-described embodiments, it is preferable that filler be mixed in the light-guiding member. With this, the thixotropy of the light-guiding member can be improved.

Furthermore, when the phosphor-containing resin and the light-guiding member are in contact with each other in the above-described embodiments, it is preferable that $n1 \leq n2$ be satisfied, when the refractive index of the phosphor-containing resin is denoted by $n1$ and the refractive index of the light-guiding member is denoted by $n2$. With this, it is possible to allow the light from the LED chip to incident on the light-guiding member, without causing the total reflection on the interface between the phosphor-containing resin and the light-guiding member. Thus, the luminance in the light-guiding member can be improved.

Furthermore, it is preferable that the diameter of the phosphor-containing resin be small so that the absorption of the light, which is emitted from the LED chip, by the phosphor-containing resin can be suppressed and the light extraction efficiency can be improved. Furthermore, when the light-emitting device is applied to the backlight unit, it is preferable that the diameter of the phosphor-containing resin be smaller than the thickness of the light-guiding plate. With this, light-incident efficiency from the light-emitting device to the light-guiding plate can be improved, and it is possible to suppress decrease in the light-incident efficiency accompanied by the thinner light-guiding plate.

Furthermore, the white light propagating in the light-guiding member is redirected by adding the diffusion material to the light-guiding member in Embodiment 3 described above. However, the present invention is not limited to this. For example, a reflective material and a bump that cause diffuse reflection may be formed on the surface of (i) the light-guiding member, (ii) on the board, or (iii) on the member between the light-guiding member and the board. With this, the white light propagating in the light-guiding member can be redirected such that the white light travels to the upper surface (light extraction surface). Further, in this case, it is preferable that density of the reflective material and the like on the side near the LED chip be low and density of the reflective material and the like on the side far from the LED chip be high. It is preferable that the density of the reflective material and the like be higher as the distance from the LED chip increases. With this, it is possible to improve the luminance uniformity in the light-guiding member.

Furthermore, although the groove is formed to regulate the position of the light-guiding member in the variation described above, the present invention is not limited to this. For example, the groove may be formed to regulate the position of the phosphor-containing resin.

Furthermore, although the LED chip 21 used in the above embodiments is an upper-face double electrode type LED chip, i.e. both the p-side electrode 21a and the n-side electrode 21b are formed on the upper surface side, the present invention is not limited to this. For example, an upper and lower electrode-type LED chip, i.e. the p-side electrode (or the n-side electrode) is formed on the upper surface and the n-side electrode (or the p-side electrode) is formed on the lower surface, may be used. Further, a bump may be provided between the LED chip and the metal line to perform a flip-chip bonding so that the LED chip and the metal line are connected without using a wire. With the flip-chip bonding, reflection by the wire is eliminated and thus the light extraction efficiency can be improved.

Furthermore, although the light-emitting device in the above embodiments is configured such that white light is emitted using the blue LED and the yellow phosphors, the present invention is not limited to this. The light-emitting device may be configured such that white light is emitted by using phosphor-containing resin which contains red phosphors and green phosphors in combination with the blue LED.

Furthermore, although a metal base board is used as the board 10 in the above embodiments, the present invention is not limited to this. For example, a dielectric board such as a ceramic board and the like made of $AlO_3$ may be used. In this case, since the ceramic board has insulative properties, the insulating film 11 does not have to be formed on the surface of the board.

Furthermore, although a plurality of the bare chips 21 are arranged and mounted on the board 10 to form a row in the above embodiments, it may be configured such that the bare chips are arranged and mounted to form a plurality of rows of two rows (two dimensional) or more.

Furthermore, although the backlight unit, the liquid crystal display apparatus, or the lighting apparatus are described in the above embodiments as examples of application of the light-emitting device, the present invention is not limited to such examples. Other than the above, for example, the light-emitting device can be applied to a lamp light source of a copying machine, a guide light, or a sign device. Further, the light-emitting device can be used as a light source in industrial use such as a line light source for inspection.

Other than the above, various modifications to the above-described embodiments that may be conceived by a person of ordinary skill in the art which do not depart from the essence of the present invention are intended to be within the scope of the present invention. Furthermore, each component in a plurality of embodiments may be arbitrarily combined within a scope not departing from the essence of the present invention.

INDUSTRIAL APPLICABILITY

The present invention can be widely used, and the examples of application include: a light-emitting device using a semiconductor light-emitting element such as an LED as a light source, a backlight unit, a liquid crystal display apparatus; a lighting apparatus such as a linear fluorescent lamp; a guide light; a sign device; an electronic equipment such as a copying machine; or an industrial use such as a line light source for inspection.

REFERENCE SIGNS LIST 10, 710 Board
11 Insulating film
20, 720, 820 Light-emitting part
21, 621, 721 LED chip
21a P-side electrode
21b N-side electrode
22, 722, 822 Phosphor-containing resin
30, 230, 330, 330A, 830 Light-guiding member
40, 740 Metal line
41 Plating
60, 760, 921 Wire
70 Die attach material
80 Resist
100, 200, 300, 300A, 440, 521, 620, 700, 800 Light-emitting device
400, 520 Backlight unit
410 Casing 411 Opening
412 Flange
413 Screw hole
420 Reflector sheet
430 Light-guiding plate
450 Optical sheets
451 Diffuser sheet
452 Prism sheet
453 Light-polarizing sheet
460 Front frame
461 Screw
470 Heat sink
500 Liquid crystal display apparatus
510 Liquid crystal display panel
530 Housing
600 Lighting apparatus
610 Glass tube
630 Base pin
640 Base
840 Line pattern
940 Resin paste

The invention claimed is:

1. A light-emitting device comprising:
a board;
a plurality of light-emitting parts each of which includes (i) a semiconductor light-emitting element mounted on said board and (ii) a wavelength conversion layer including a light wavelength converter and covering said semiconductor light-emitting element; and
a plurality of light-guiding members each of which is provided on said board, between said light-emitting parts which are adjacent to each other,
wherein each of said light-guiding members is formed to cover part of said wavelength conversion layer included in said light-emitting part.

2. The light-emitting device according to claim 1, wherein said light-guiding member is adjacent to said wavelength conversion layer.

3. The light-emitting device according to claim 1, wherein at least an end portion of said light-guiding member on a side of said semiconductor light-emitting element is on a side of said semiconductor light-emitting element with respect to a normal that extends from an intersection between said board and one of (i) an outline of said light-emitting part and (ii) an extension of the outline.

4. The light-emitting device according to claim 1, wherein said light-guiding member connects said light-emitting parts which are adjacent to each other.

5. The light-emitting device according to claim 1, wherein said light-guiding member has a function of diffusing light that is guided in said light-guiding member.

6. The light-emitting device according to claim 5, wherein said light-guiding member includes a diffusion material.

7. The light-emitting device according to claim 6, wherein density of said diffusion material in said light-guiding member is higher as a distance from said semiconductor light-emitting element is greater.

8. The light-emitting device according to claim 1, wherein $n1 \leq n2$ is satisfied, when a refractive index of said wavelength conversion layer is denoted by n1 and a refractive index of said light-guiding member is denoted by n2.

9. The light-emitting device according to claim 1, wherein said light-guiding member is a transparent resin.

10. The light-emitting device according to claim 1, wherein said wavelength conversion layer is a phosphor layer including a phosphor which is excited by light of said semiconductor light-emitting element.

11. The light-emitting device according to claim 1, wherein said wavelength conversion layer is dome-shaped.

12. The light-emitting device according to claim 4, wherein said board is elongated, and
said light-emitting parts and said light-guiding member are arranged linearly in a row along a longer direction of said board.

13. The light-emitting device according to claim 12, wherein $0 \leq D1/L1 \leq L1/2n$ is satisfied, when a distance between said light-guiding members which are adjacent to each other is denoted by D1, a length of said board in the longer direction is denoted by L1, and the number of said semiconductor light-emitting elements is denoted by n.

14. The light-emitting device according to claim 1, wherein $10 \leq L1/L2$ is satisfied, when a length of said board in a longer direction is denoted by L1, and a length of said board in a shorter direction is denoted by L2.

15. The light-emitting device according to claim 1, wherein $0 < h2/h1 \leq 1$ is satisfied, when a height of said light-emitting part is denoted by h1 and a height of said light-guiding member is denoted by h2.

16. The light-emitting device according to claim 1, wherein a groove for regulating a position of an end portion of said light-guiding member is formed on said board.

17. A backlight unit comprising
the light-emitting device according to claim 1.

18. A liquid crystal display apparatus comprising:
the backlight unit according to claim 17; and
a liquid crystal panel provided on an optical path of light emitted from said backlight unit.

19. A lighting apparatus comprising
the light-emitting device according to claim 1.

* * * * *